(12) United States Patent
Park

(10) Patent No.: US 11,428,742 B2
(45) Date of Patent: *Aug. 30, 2022

(54) WIRELESS CONTROL SYSTEM, WIRELESS CONNECTION METHOD, AND BATTERY PACK

(71) Applicant: LG CHEM, LTD., Seoul (KR)

(72) Inventor: Chan-Ha Park, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 87 days.

This patent is subject to a terminal disclaimer.

(21) Appl. No.: 17/044,139

(22) PCT Filed: Oct. 21, 2019

(86) PCT No.: PCT/KR2019/013837
§ 371 (c)(1),
(2) Date: Sep. 30, 2020

(87) PCT Pub. No.: WO2020/105869
PCT Pub. Date: May 28, 2020

(65) Prior Publication Data
US 2021/0025944 A1    Jan. 28, 2021

(30) Foreign Application Priority Data

Nov. 21, 2018   (KR) .................. 10-2018-0144856

(51) Int. Cl.
*G01R 31/371*   (2019.01)
*G01R 31/392*   (2019.01)
(Continued)

(52) U.S. Cl.
CPC ......... *G01R 31/371* (2019.01); *G01R 31/392* (2019.01); *G01R 31/396* (2019.01); *H04L 12/403* (2013.01)

(58) Field of Classification Search
CPC .. G01R 31/371; G01R 31/392; G01R 31/396; H04L 12/403
See application file for complete search history.

(56) References Cited

U.S. PATENT DOCUMENTS 9,293,935 B2    3/2016  Lee et al.
2004/0203362 A1  10/2004  Pattabiraman et al.
(Continued)

FOREIGN PATENT DOCUMENTS

CN    102224711 A    10/2011
CN    102356634 A    2/2012
(Continued)

OTHER PUBLICATIONS

Office Action dated Oct. 26, 2021 issued by the Japanese Patent Office in a corresponding Japanese patent application No. 2020-541398.
(Continued)

*Primary Examiner* — Bryan Bui
(74) *Attorney, Agent, or Firm* — Morgan, Lewis & Bockius LLP

(57) ABSTRACT

The present disclosure includes a wireless control system, a wireless connection method, and a battery pack. The wireless control system includes a master and a plurality of slaves. Each slave wirelessly transmits a response packet including an ID of each slave when it receives a first command packet wirelessly transmitted from the master. The master sets, as a first group, each slave to which is allocated the ID included in each response packet wirelessly received within a predetermined period of time from a time point at which the first command packet was transmitted, and sets, as a second group, each slave not set as the first (Continued)

group. The master wirelessly transmits a second command packet including the ID of each slave belonging to the second group.

11 Claims, 7 Drawing Sheets

(51) Int. Cl.
    *G01R 31/396*     (2019.01)
    *H04L 12/403*     (2006.01)

(56) References Cited

U.S. PATENT DOCUMENTS

| | | |
|---|---|---|
| 2005/0251396 A1 | 11/2005 | Tyler |
| 2011/0231509 A1 | 9/2011 | Schriefer et al. |
| 2011/0300895 A1 | 12/2011 | Tsuroka |
| 2012/0011535 A1 | 1/2012 | Eguchi et al. |
| 2014/0365792 A1 | 12/2014 | Yun |
| 2015/0079907 A1 | 3/2015 | Engelien-Lopes |
| 2016/0056510 A1 | 2/2016 | Takeuchi et al. |
| 2016/0360548 A1 | 12/2016 | Nguyen et al. |
| 2017/0346308 A1* | 11/2017 | Kain ............... H02J 7/0014 |
| 2018/0012484 A1 | 1/2018 | Sakabe et al. |
| 2018/0249365 A1 | 8/2018 | Cho et al. |
| 2020/0200828 A1* | 6/2020 | Sung ............... G01R 31/382 |
| 2021/0037407 A1* | 2/2021 | Park ............... H04L 12/40019 |

FOREIGN PATENT DOCUMENTS

| | | |
|---|---|---|
| CN | 108141875 A | 6/2018 |
| JP | 2015-162792 A | 9/2015 |
| JP | 6421625 B2 | 11/2018 |
| KR | 2003-0039120 A | 5/2003 |
| KR | 10-2014-0060801 A | 5/2014 |
| KR | 10-2014-0066751 A | 6/2014 |
| KR | 10-2014-0073949 A | 6/2014 |
| KR | 10-2014-0078323 A | 6/2014 |
| KR | 10-2014-0143076 A | 12/2014 |
| KR | 10-2017-0024330 A | 3/2017 |
| KR | 10-2017-0056061 A | 5/2017 |
| KR | 10-2017-0116377 A | 10/2017 |
| KR | 10-2018-0079769 A | 7/2018 |
| WO | 2014/103008 A1 | 7/2014 |

OTHER PUBLICATIONS

International Search Report issued in corresponding International Patent Application No. PCT/KR2019/013837, dated Jan. 29, 2020.
Ren Xiaohong et al., "Wireless Data Acquisition System Design Based on Bluetooth Technology," Measurement & Control Technology, 2009, 28(01), pp. 16-19, Jan. 18, 2009 (English Abstract).
Office Action dated Aug. 2, 2021, issued in corresponding Chinese Patent Application No. 201980016028.5.
Extended European Search Report dated May 3, 2021, issued in corresponding European Patent Application No. 19886265.8.

* cited by examiner

WIRELESS CONTROL SYSTEM, WIRELESS CONNECTION METHOD, AND BATTERY PACK

TECHNICAL FIELD

The present disclosure relates to a wireless control system including a master and a plurality of slaves, a battery pack including the wireless control system, and a method for wireless connection between the master and the plurality of slaves.

The present application claims priority to Korean Patent Application No. 10-2018-0144856 filed in the Republic of Korea on Nov. 21, 2018, the disclosure of which is incorporated herein by reference.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available secondary batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

A battery pack for a device requiring high capacity and high voltage such as an electric vehicle generally includes a plurality of battery modules connected in series. To manage the condition of the plurality of battery modules individually and efficiently, a control system having a multi slave structure is disclosed. The control system having a multi slave structure includes a plurality of slaves for monitoring the condition of each battery module and a master that controls all the plurality of slaves.

However, when wireless communication is carried out between the master and the plurality of slaves, wireless connection between the master and at least one slave may be unwantedly disconnected due to external noise.

DISCLOSURE

Technical Problem

The present disclosure is designed to solve the above-described problem, and therefore the present disclosure is directed to providing a system and method for wireless control in which a master selects only each slave having failed wireless connection with the master among a plurality of slaves and retries wireless connection, and a battery pack including the wireless control system.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A wireless control system according to an aspect of the present disclosure includes a master configured to wirelessly transmit a first command packet; and a plurality of slaves configured to monitor a condition of a plurality of battery modules. Each of the plurality of slaves is configured to wirelessly transmit a response packet including an ID of the corresponding slave in response to the first command packet when receiving the first command packet. The master is configured to set, as a first group, each slave to which the ID included in each response packet wirelessly received within a predetermined period of time from a time point at which the first command packet was transmitted is allocated. The master is configured to set, as a second group, each slave not set as the first group among the plurality of slaves. The master is configured to wirelessly transmit a second command packet when at least one of the plurality of slaves belongs to the second group. The second command packet includes the ID of each slave belonging to the second group.

The master is configured to wirelessly transmit the second command packet with a first amplified signal strength associated with an ID of a lowest rank among the IDs of each slave belonging to the second group.

Each of the plurality of slaves is configured to delete the second command packet when the second command packet does not include the ID of the corresponding slave.

Each of the plurality of slaves is configured to wirelessly transmit the response packet in response to the second command packet when the second command packet includes the ID of the corresponding slave.

Each of the plurality of slaves is configured to, determine a relative rank of the ID of the corresponding slave among all the IDs included in the second command packet when the second command packet includes the ID of the corresponding slave. Each of the plurality of slaves is configured to wirelessly transmit the response packet at a time slot allocated to the relative rank.

When the second command packet includes a gain value, each of the plurality of slave is configured to determine a second amplified signal strength by multiplying a predetermined signal strength by the gain value. Each of the plurality of slave is configured to wirelessly transmit the response packet with the second amplified signal strength.

When the second command packet includes a gain value, each of the plurality of slaves is configured to determine a third amplified signal strength by multiplying a reference signal strength allocated to the corresponding slave by the gain value. Each of the plurality of slaves is configured to wirelessly transmit the response packet with the third amplified signal strength.

The master is configured to classify a first slave from the second group to the first group when receiving the response packet from the first slave belonging to the second group within a predetermined period of time from a time point at which the second command packet was transmitted.

A battery pack according to another aspect of the present disclosure includes the wireless control system.

A method according to still another aspect of the present disclosure is for wireless connection between the master and the plurality of slaves included in the wireless control system. The method includes wirelessly transmitting, by the master, a first command packet to the plurality of slaves; wirelessly transmitting, by each slave, a response packet including an ID of the corresponding slave in response to the first command packet when receiving the first command packet; setting, by the master, as a first group, each slave to which the ID included in each response packet wirelessly received within a predetermined period of time from a time point at which the first command packet was transmitted is allocated, and setting, as a second group, the remaining slave not set as the first group among the plurality of slaves; and wirelessly transmitting, by the master, a second command packet including the IDs of all the slaves belonging to the second group when at least one of the plurality of slaves belongs to the second group.

The method further includes, determining, by each slave, a relative rank of the ID of the corresponding slave among all the IDs included in the second command packet when the second command packet includes the ID of the corresponding slave; and wirelessly transmitting, by each slave, the response packet at a time slot allocated to the relative rank.

Advantageous Effects

According to at least one of the embodiments of the present disclosure, the master may only select each slave having failed wireless connection with the master among all the slaves and retry wireless connection.

In addition, according to at least one of the embodiments of the present disclosure, when wireless connection between the master and at least one slave fails, the master and the at least one slave may wirelessly transmit a signal to the opposite party with higher signal strength than normal condition (i.e., when wireless connection succeeds).

As a result, it is possible to reduce the time required for wireless connection of the master with all the slaves.

The effects of the present disclosure are not limited to the effects mentioned above, and these and other effects will be clearly understood by those skilled in the art from the appended claims.

BRIEF DESCRIPTION OF DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

BEST MODE

Figure 1:
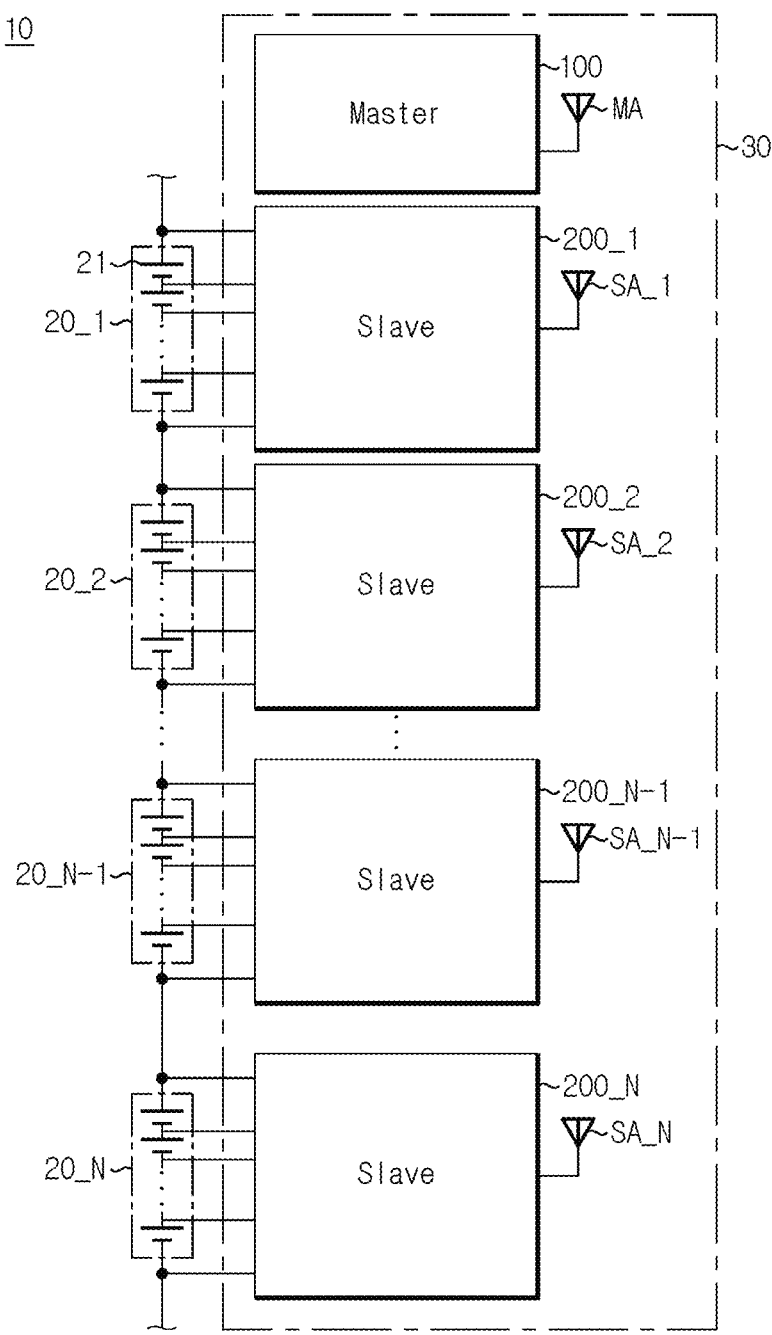
FIG. 1 is an exemplary diagram showing the configuration of a battery pack including a wireless control system.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term <control unit> as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

FIG. 1 is an exemplary diagram showing the configuration of a battery pack 10 including a wireless control system 30 according to an embodiment of the present disclosure.

Referring to FIG. 1, the battery pack 10 includes N battery modules 20 and the wireless control system 30. N is a natural number of 2 or greater. In the drawing, to identify the N battery modules 20, the reference signs 200_1~200_N are given to the N battery modules 20 in a sequential order. The battery pack 10 may be mounted in an electric vehicle to supply power required to run an electric motor of the electric vehicle.

The N battery modules 20_1~20_N (N is a natural number of 2 or greater) are connected in series and/or in parallel. Each battery module 20 includes at least one battery cell 21.

The wireless control system 30 includes a master 100 and N slaves 200. In the drawing, to identify the N slaves 200, the reference signs 200_1~200_N are given to the N slaves 200 in a sequential order.

The master 100 is configured to control the entire battery pack 10. Each of the plurality of slaves 200_1~200_N is configured to perform wireless communication with the master 100 using an ID of each slave 200_1~200_N allocated from the master 100. The master 100 stores the IDs allocated to the plurality of slaves 200_1~200_N. The IDs are identification information for identifying the plurality of slaves 200_1~200_N.

The master 100 may communicate with an external main controller (e.g., an electronic control unit (ECU) of the electric vehicle) via a wired network such as Control Area Network (CAN). The master 100 includes a master antenna MA, and may wirelessly communicate with each slave 200 through the master antenna MA.

The plurality of slaves 200_1~200_N is connected to the plurality of battery modules 20_1~20_N one-to-one. When i=1~N, the slave 200_i is configured to monitor the condition (e.g., voltage, current, temperature) of the battery module 20_i. The power required for the operation of the slave 200_i may be supplied from the battery module 20_i.

Additionally, the slave 200_i may wirelessly transmit data (hereinafter referred to as 'battery information') indicating the monitored condition of the battery module 20_i to the master 100.

The master 100 may calculate a state of charge (SOC) and a state of health (SOH) of the battery module 20_i, or determine overvoltage, undervoltage, overcharge or overdischarge of the battery module 20_i, based on the battery information from the slave 200_i.

The plurality of slaves 200_1~200_N is positioned at different areas inside the battery pack 10 such that communication distances to the master 100 are different to each other. The communication distance between the slave 200_i and the master 100 may be a straight line distance between the antenna SA_i of the slave 200_i and the antenna MA of the master 100. Hereinafter, it is assumed that the communication distance between the slave 200_i and the master 100 is shorter than the communication distance between the slave 200_i+1 and the master 100. For example, referring to FIG. 1, the antenna SA_i of the slave 200_i is positioned closer to the antenna MA of the master 100 than the antenna SA_i+1 of the slave 200_i+1. The antenna SA_i of the slave 200_i may be positioned on the 'upstream side' of the antenna SA_i+1 of the slave 200_i+1, and the antenna SA_i+1 of the slave 200_i+1 may be positioned on the 'downstream side' of the antenna SA_i of the slave 200_i.

Hereinafter, it is assumed that an ID of higher rank is allocated to a slave having a shorter communication distance with the master 100. For example, the rank of the ID of the slave 200_i is higher than the rank of the ID of the slave 200_i+1.

The master 100 is configured to classify each of the plurality of slaves 200_1~200_N as any one of a first group and a second group in each predetermined cycle. The master 100 may transmit a command packet, and scan a response packet from the second group for a standby period.

When the command packet includes the ID of the slave 200, the corresponding slave 200 may be configured to wirelessly transmit a response packet to the master 100 in response to the command packet.

When the master 100 receives a response packet from a specific slave (e.g., 200_2) belonging to the second group within a predetermined period of time from the transmission of the command packet, the master 100 classifies the corresponding specific slave from the second group to the first group. On the contrary, when the master 100 does not receive a response packet from the specific slave belonging to the second group, the master 100 maintains the corresponding specific slave as the second group.

Figure 2:
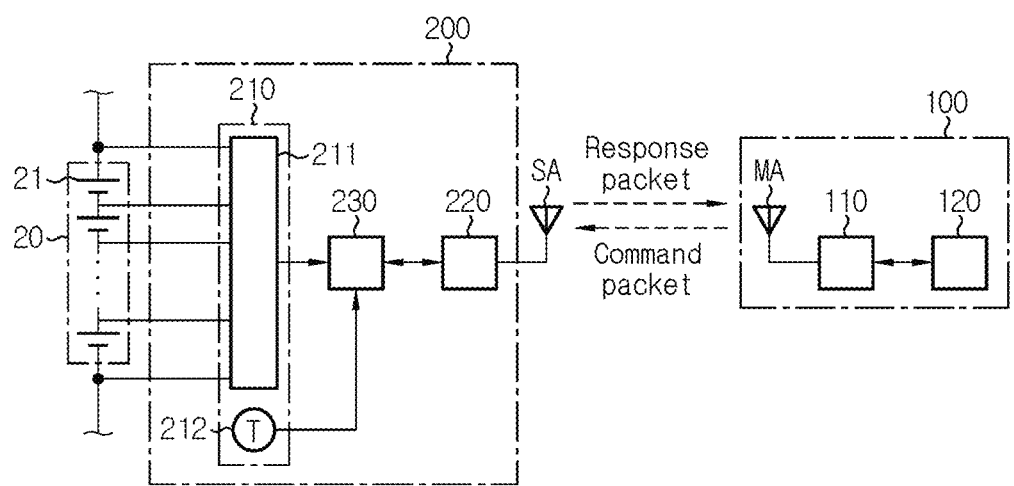
FIG. 2 is an exemplary diagram showing the detailed configuration of a master and a slave of FIG. 1.

FIG. 2 is an exemplary diagram showing the detailed configuration of the master 100 and the slave 200 of FIG. 1.

Referring to FIG. 2, the master 100 includes an antenna MA, a wireless communication circuit 110 and a control unit 120. The power required for the operation of the master 100 may be supplied from at least one of the plurality of battery modules 20_1~20_N or an external power source.

The wireless communication circuit 110 is configured to wirelessly transmit a command packet to the slave 200 through the antenna MA. Additionally, the wireless communication circuit 110 is configured to receive a response packet from the slave 200 through the antenna MA.

The control unit 120 is operably connected to the wireless communication circuit 110. The control unit 120 may determine request information to at least one of the plurality of slaves 200_1~200_N based on a signal (e.g., indicating battery information) received through the antenna MA, and wirelessly transmit a command packet including data indicating the request information to at least one of the plurality of slaves 200_1~200_N.

The control unit 120 may be implemented, by hardware, using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions. The control unit 120 may have a memory device embedded therein, and the memory device may include, for example, RAM, ROM, register, hard disk, an optical recording medium or a magnetic recording medium. The memory device may store, update and/or erase programs including various types of control logics that are executed by the control unit 120, and/or data created when the control logics are executed.

The slave 200 includes an antenna SA, a sensing unit 210, a wireless communication circuit 220 and a control unit 230.

The sensing unit 210 includes a voltage measurement circuit 211 and a temperature sensor 212. The sensing unit 210 may further include a current sensor (not shown). The voltage measurement circuit 211 includes at least one voltage sensor.

The voltage measurement circuit 211 measures a module voltage of the battery module 20. The module voltage is a voltage across the battery module 20. Additionally, the voltage measurement circuit 211 may further measure a cell voltage of each battery cell 21 included in the battery module 20. The cell voltage is a voltage across the battery cell 21. The voltage measurement circuit 211 transmits a voltage signal indicating the module voltage and the voltage of the cell 21 to the control unit 230.

The temperature sensor 212 is positioned within a predetermined distance from the battery module 20, and transmits a temperature signal indicating the temperature of the battery module 20 to the control unit 230.

The current sensor is installed on a charge/discharge current path of the battery pack 10, and measures the current flowing during charging/discharging of the battery pack 10 and transmits a current signal indicating the measured current to the control unit 230.

The wireless communication circuit 220 is connected to the control unit 230 and the antenna SA. The wireless communication circuit 220 may be implemented, by hardware, using System on Chip (RF SoC). The wireless communication circuit 220 may wirelessly transmit data to the master 100 or the slave 200 or wirelessly receive data from the master 100 or the slave 200 through the antenna SA.

The control unit 230 may be operably coupled to the sensing unit 210 and the wireless communication circuit 220 to individually control the operation of each of the sensing unit 210 and the wireless communication circuit 220. The control unit 230 may be implemented, by hardware, using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions. The control unit 230 may have a memory device embedded therein, and the memory device may include, for example, RAM, ROM, register, hard disk, an optical recording medium or a magnetic recording medium. The memory device may store, update and/or erase programs including various types of control logics that are executed by the control unit 230, and/or data created when the control logics are executed.

The wireless communication circuit 220 is configured to selectively perform at least one of predefined functions in response to the signal from the master 100 or the slave 200 wirelessly received through the antenna SA.

When a signal is received through the antenna SA, the wireless communication circuit 220 may measure the signal strength of the received signal. When the wireless communication circuit 220 receives a command packet from the master 100 through the antenna SA, the wireless communication circuit 220 may wirelessly transmit a response packet to the master 100 in response to the command packet. The response packet is a signal for reporting to the master 100 that the slave 200 succeeded in receiving the command packet wirelessly transmitted from the master 100.

Figure 3:
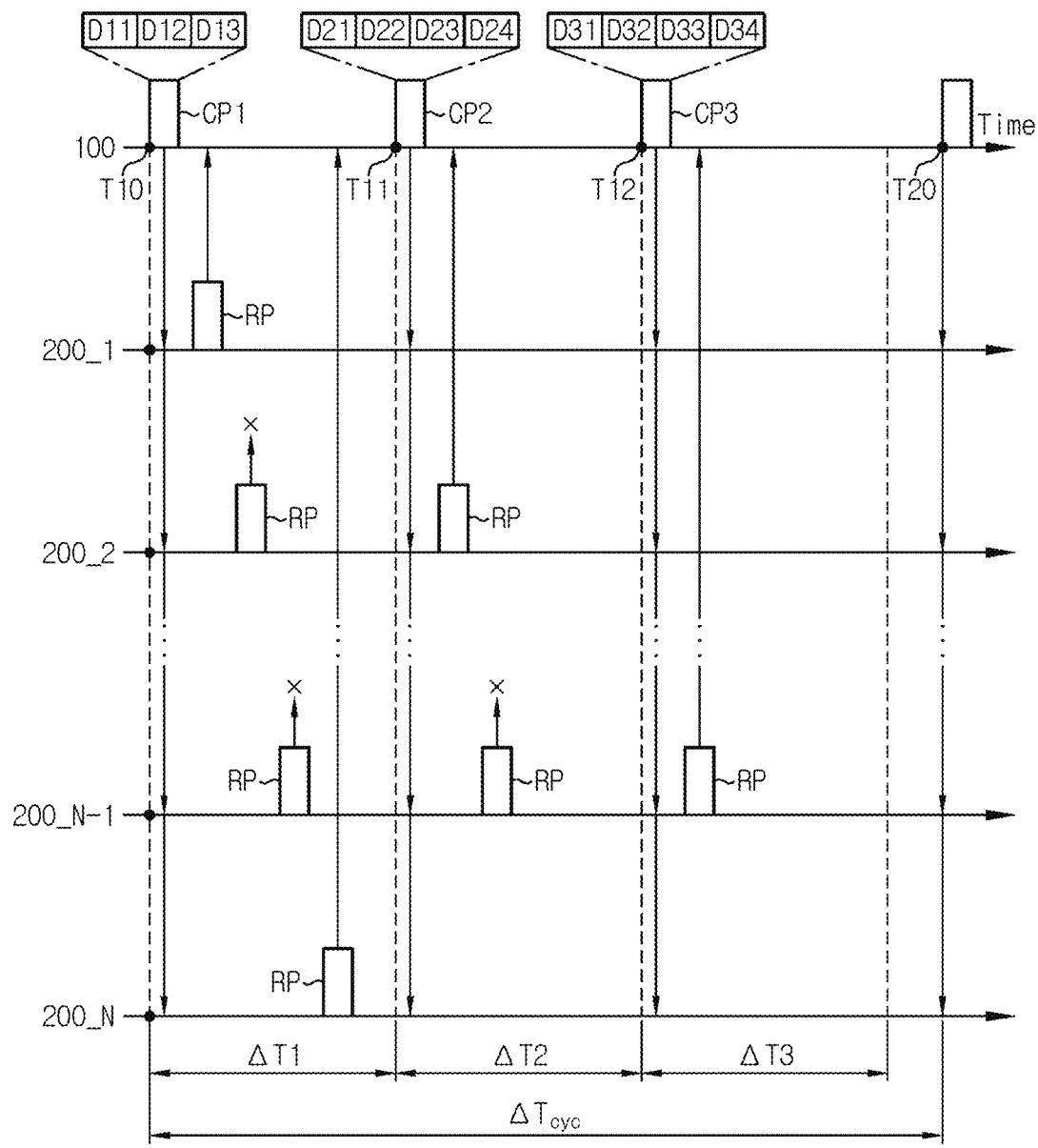
FIG. 3 is a timing chart illustrating a process of establishing wireless connection between the master of FIG. 1 and a plurality of slaves.

FIG. 3 is a timing chart illustrating a process of establishing wireless connection between the master 100 of FIG. 1 and the plurality of slaves 200_1~200_N.

In FIG. 3, the time point T10 may indicate a start time of an arbitrary cycle, and the time point T20 may indicate a start time of the next cycle. Additionally, it is assumed that a time interval $\Delta T_{cyc}$ of each cycle is divided into N or more time slots, and N time slots are allocated to the plurality of slaves 200_1~200_N in a sequential order.

At the time point T10, the master 100 wirelessly transmits a command packet CP1 to the plurality of slaves 200_1~200_N. The master 100 may wirelessly transmit the command packet CP1 with a predetermined first signal strength. The command packet CP1 may be transmitted from the master 100 to the plurality of slaves 200_1~200_N all at once through a broadcasting method. The command packet CP1 includes first data D1I and second data D12. The command packet CP1 may further include third data D13. The first data D11 of the command packet CP1 indicates whether the master 100 transmitted the corresponding command packet for the first time in the current cycle. For example, the first data D11 being a first value (e.g., 0) indicates that the corresponding command packet is transmitted for the first time in the current cycle. The second data D12 of the command packet CP1 includes request information to the plurality of slaves 200_1~200_N. The request information is for requesting a slave belonging to the second group to perform a specific function (e.g., voltage measurement, cell balancing). The third data D13 of the command packet CP1 includes the IDs of all of the plurality of slaves 200_1~200_N.

Each of the plurality of slaves 200_1~200_N wirelessly transmits a response packet RP at the time slot allocated to each slave 200_1~200_N when wirelessly receiving the command packet CP1. That is, when i=1~N, the slave 200_i wirelessly transmits the response packet RP at the $i^{th}$ time slot among the N or more time slots.

The master 100 scans the response packet RP from the plurality of slaves 200_1~200_N for a predetermined period of time $\Delta T1$ from the time point T10. Hereinafter, assume that the master 100 received the response packet RP from each of the slaves 200_1, 200_3~200_N-2, 200_N within the predetermined period of time $\Delta T1$ from the time point T10, but did not receive the response packet RP from each of the slaves 200_2, 200_N-1. Then, the master 100 may set each of the slaves 200_1, 200_3~200_N-2, 200_N to which the ID included in the response packet RP is allocated as the first group, and set, as the second group, the remaining slaves 200_2, 200_N-1 not set as the first group among the plurality of slaves 200_1~200_N.

At the time point T11, only two slaves 200_2, 200_N-1 are set as the second group, while the remaining slaves 200_1, 200_3~200_N-2, 200_N are set as the first group.

At the time point T11, the master 100 wirelessly transmits a command packet CP2. The command packet CP2 includes first data D21, second data D22 and third data D23, and may further include fourth data D24. The first data D21 of the command packet CP2 has a second value (e.g., 1), and the second value indicates that the corresponding command packet is for retrying wireless connection with the second group. The second data D22 of the command packet CP2 includes request information to the slaves 200_2, 200_N-1 set as the second group. The third data D23 of the command packet CP2 includes the IDs of the two slaves 2002, 200_N-1 belonging to the second group. The fourth data D24 of the command packet CP2 may indicate a gain value.

The command packet CP2 may be received by all the plurality of slave 200_1~200_N, while the command packet CP2 includes only the IDs of the two slaves 200_2, 200_N-1 belonging to the second group. Thus, each of the slaves 200_1, 200_3~200_N-2, 200_N set as the first group may delete the command packet CP2 from the memory devices thereof.

In contrast, when each of the slaves 2002, 200_N-1 belonging to the second group receives the command packet CP2, each of the slaves 200_2, 200_N-1 belonging to the second group may determine a relative rank of the ID thereof to all the IDs included in the command packet CP2. When the slave 200_2 receives the command packet CP2, the slave 200_2 determines the rank of the ID of the slave 200_2 to be highest since there is no ID having a higher rank than the ID of the slave 200_2 among all the IDs included in the third data D23 of the command packet CP2. When the slave 200_N-1 receives the command packet CP2, the slave 200_N-1 may determine the rank of the ID of the slave 200_N-1 to be second highest since there is one ID having a higher rank than the ID of the slave 200_N-1 among all the IDs included in the third data D23 of the command packet CP2.

The slave 200_2 transmits the response packet RP to the master 100 at a timing (i.e., the first time slot) associated with the relative rank of the ID of the slave 200_2. The slave 200_N-1 transmits the response packet RP including the ID of the slave 200_N-1 to the master 100 at a timing (i.e., the second time slot) associated with the relative rank of the ID of the slave 200_N-1.

Each of the slave 200_2 and the slave 200_N-1 may wirelessly transmit the response packet RP with a predetermined second signal strength.

Alternatively, each of the slave 200_2 and the slave 200_N-1 may wirelessly transmit the response packet RP with a reference signal strength allocated to each of the slave 200_2 and the slave 200_N-1. When i=1~N, the reference signal strength allocated to the slave 200_i may be higher than the reference signal strength allocated to the slave 200_i-1. That is, a higher reference signal strength may be allocated to a slave having a longer communication distance with the master 100.

Alternatively, each of the slave 200_2 and the slave 200_N-1 may determine an amplified signal strength, and wirelessly transmit the response packet RP with the amplified signal strength. The amplified signal strength may be a result of multiplying the predetermined second signal strength or the reference signal strength allocated to each slave by the gain value indicated by the fourth data D4 of the command packet CP2.

The master 100 scans the response packet RP from the slaves 2002, 200_N-1 belonging to the second group for a predetermined period of time ΔT2 from the time point T11. ΔT2 may be equal to or shorter or longer than ΔT1. Assume that the master 100 received the response packet RP from the slave 200_2 within the predetermined period of time ΔT2 from the time point T11, but did not receive the response packet RP from the slave 200_N-1. For example, the response packet RP from the slave 200_N-1 may be lost by a signal interference phenomenon while it is transmitted to the master 100. Then, the master 100 sets the slave 200_2 from the second group to the first group, and maintains the slave 200_N-1 as the second group.

In the time point T12, the master 100 wirelessly transmits a command packet CP3. The command packet CP3 includes first data D31, second data D32 and third data D33, and may further include fourth data D34. The first data D31 of the command packet CP3 may have the second value. The second data D32 of the command packet CP3 includes request information to the slave 200_N-1 set as the second group. The third data D33 of the command packet CP3 includes only the ID of the slave 200_N-1 belonging to the second group. The fourth data D34 of the command packet CP3 may indicate a gain value.

The command packet CP3 may be received by all the plurality of slave 200_1~200_N, while the command packet CP3 includes only the ID of the slave 200_N-1 belonging to the second group. Thus the slaves 200_1~200_N-2, 200_N set as the first group may remove the command packet CP3. When slave 200_N-1 receives the command packet CP3, the slave 200_N-1 may determine a relative rank of the ID of the slave 200_N-1 to all the IDs included in the command packet CP3. As the third data D33 of the command packet CP3 includes only the ID of the slave 200_N-1, the slave 200_N-1 determines the rank of the ID of the slave 200_N-1 to be highest. Accordingly, the slave 200_N-1 transmits the response packet RP to the master 100 at a timing (i.e., the first time slot) associated with the relative rank of the ID of the slave 200_N-1.

The slave 200_N-1 may wirelessly transmit the response packet RP with the predetermined second signal strength. Alternatively, the slave 200_N-1 may wirelessly transmit the response packet RP with the reference signal strength allocated to the slave 200_N-1. Alternatively, the slave 200_N-1 may determine an amplified signal strength, and wirelessly transmit the response packet RP with the amplified signal strength. The amplified signal strength may be the predetermined second signal strength or the reference signal strength allocated to the slave 200_N-1 multiplied by the gain value indicated by the fourth data D34 of the command packet CP3.

The master 100 scans the response packet RP from the slave 200_N-1 belonging to the second group for a predetermined period of time ΔT3 from the time point T12. ΔT3 may be equal to or shorter or longer than ΔT1. When the master 100 receives the response packet RP from all the slaves 200_N-1 belonging to the second group within the predetermined period of time ΔT2 from the time point T12, the master 100 may terminate the process for wireless connection with the plurality of slaves 200_1200_N.

Hereinafter, it is assumed that the 'first command packet' refers to a command packet having the first value as the first data, and the 'second command packet' refers to a command packet having the second value as the first data.

Figure 4:
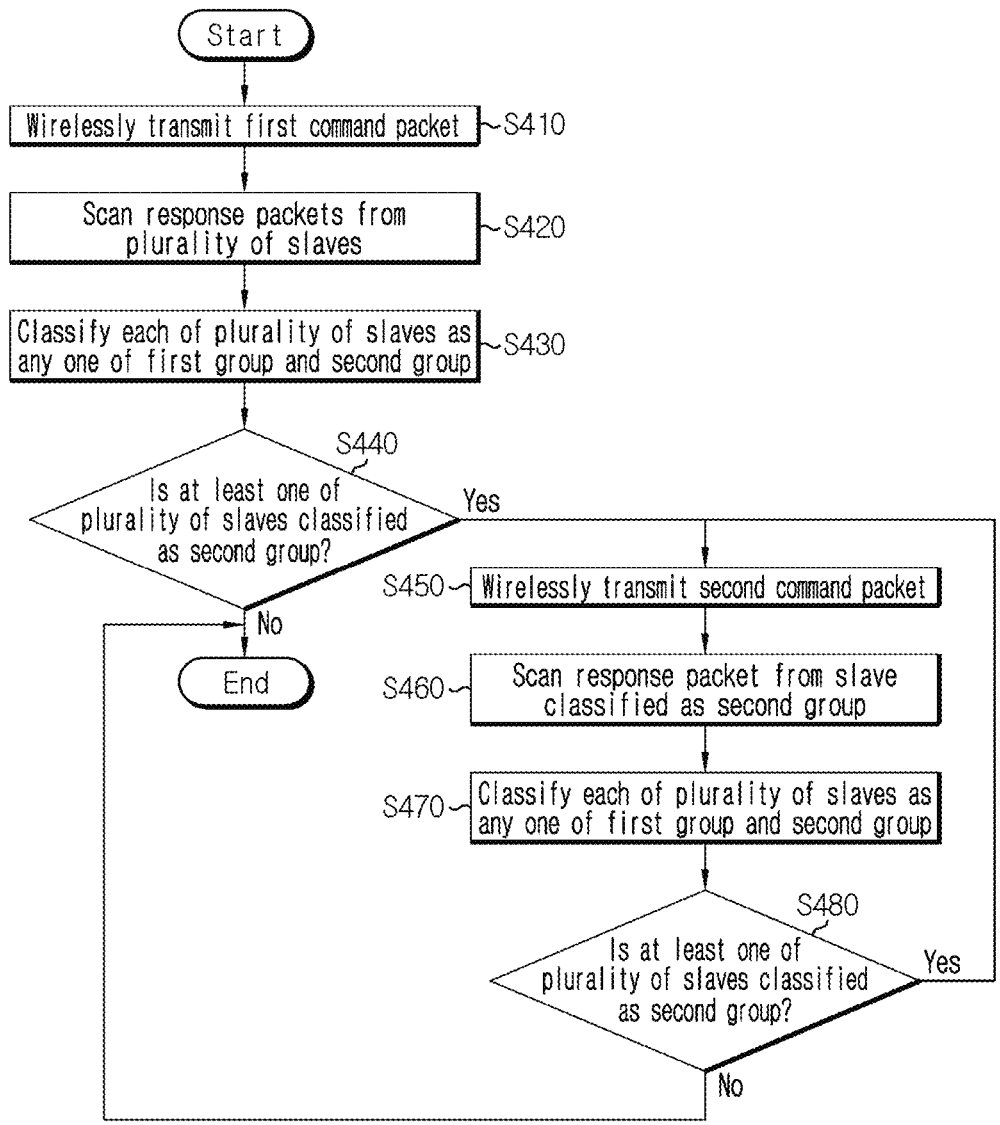
FIG. 4 is a flowchart showing a method for wireless connection between a master and a plurality of slaves according to a first embodiment of the present disclosure.

FIG. 4 is a flowchart showing a method for wireless connection between the master 100 and the plurality of slaves 200_1~200_N according to the first embodiment of the present disclosure. The method of FIG. 4 may be performed in each predetermined cycle.

Referring to FIGS. 1 to 4, in step S410, the master 100 wirelessly transmits a first command packet. The first command packet may be wirelessly transmitted with the predetermined first signal strength. The first command packet includes first data and second data, and may further include third data. The first data of the first command packet has the first value indicating that the first command packet is for trying wireless connection with the plurality of slaves 200_1~200_N for the first time in the current cycle. The second data of the first command packet includes data for requesting the plurality of slaves 200_1~200_N to perform a specific function (e.g., voltage measurement, cell balancing). The third data of the first command packet includes the IDs of the plurality of slaves 200_1~200_N.

When the first data of the first command packet has the first value, each of the plurality of slaves 200_1~200_N may perform the function requested by the second data of the first command packet, and wirelessly transmit the response packet including the ID thereof with the predetermined second signal strength or the reference signal strength allocated thereto. When i=1~N, the reference signal strength allocated to the slave 200_i may be higher than the reference signal strength allocated to the slave 200_i-1. That is, a higher reference signal strength may be allocated to a slave having a longer communication distance with the master 100.

In step S420, the master 100 scans the response packet from the plurality of slaves 200_1~200_N for a first standby period. That is, the master 100 collects the response packet wirelessly transmitted by the plurality of slaves 200_1~200_N from the time point at which the first command packet was transmitted to the time point at which a predetermined period of time has passed from the transmission of the first command packet.

In step S430, the master 100 classifies each of the plurality of slaves 200_1~200_N as any one of the first group and the second group. In detail, the master 100 may classify the slave 200 to which the ID of each response packet scanned for the first standby period is allocated as the first group, and classify the remaining slave 200 as the second group. That is, the slave 200 having not transmitted the response packet or having transmitted the response packet that was not received by the master 100 may be classified as the second group by the master 100.

In step S440, the master 100 determines whether at least one of the plurality of slaves 200_1~200_N is classified as the second group. That is, the master 100 checks if at least one slave 200 is still not wirelessly connected with the master 100 in the current cycle. When a value of the step S440 is "YES", step S450 is performed. The value of the step S440 being "NO" indicates successful wireless connection of the master 100 with all the plurality of slaves 200_1~200_N, and the method may end.

In step S450, the master 100 wirelessly transmits a second command packet. The second command packet may be wirelessly transmitted to the predetermined first signal strength. The second command packet includes first data, second data and third data. The first data of the second command packet has the second value indicating that the second command packet is for retrying wireless connection between the master 100 and the second group. The second data of the second command packet includes data for requesting all the slaves 200 belonging to the second group to perform the specific function. The third data of the second command packet includes the IDs of all the slaves 200 belonging to the second group.

When receiving the second command packet, each of the plurality of slaves 200_1~200_N determines whether the third data of the second command packet includes the ID thereof in response to the first data of the second command packet having the second value. The slave 200 belonging to the second group performs the function requested by the second data of the second command packet as the third data of the second command packet includes the ID thereof, and transmits the response packet including the ID thereof with the predetermined second signal strength or the reference signal strength allocated thereto to the master 100. In contrast, the slave 200 belonging to the first group does not transmit the response packet as the second data of the second command packet does not include the ID thereof, and delete the second command packet from the memory device thereof (i.e., ignore the request made by the third data of the second command packet).

In step S460, the master 100 scans the response packet from the slave 200 classified as the second group for a second standby period. That is, the master 100 collects the response packet wirelessly transmitted by at least one slave 200 belonging to the second group from the time point at which the second command packet was transmitted to the time point at which a predetermined period of time has passed from the transmission of the second command packet.

In step S470, the master 100 classifies each of the plurality of slaves 200_1~200_N as any one of the first group and the second group. In detail, the master 100 may classify the slave 200 to which the ID of each response packet scanned for the second standby period is allocated from the second group to the first group, and maintain the remaining slave 200 as the second group. After the step S470, the method may move to the step S440 or S480.

In step S480, the master 100 determines whether at least one of the plurality of slaves 200_1~200_N belongs to the second group. When a value of the step S480 is "YES", the method returns to the step S450. The value of the step S480 being "NO" indicates that none of the plurality of slaves 200_1~200_N belongs to the second group, and the method may end.

Figure 5:
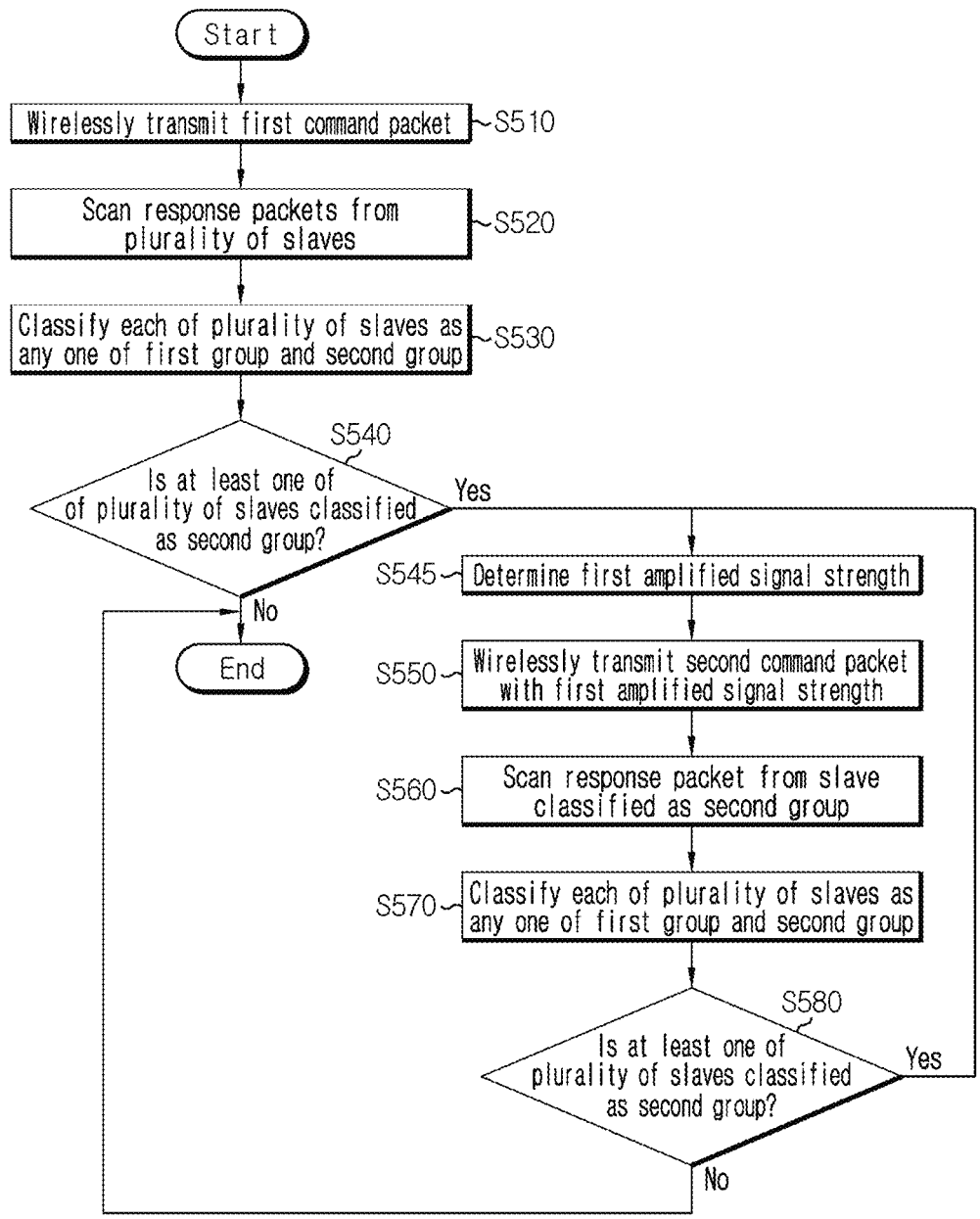
FIG. 5 is a flowchart showing a method for wireless connection between a master and a plurality of slaves according to a second embodiment of the present disclosure.
Figure 6:
FIG. 6 shows a lookup table for a second embodiment that a master references.

FIG. 5 is a flowchart showing a method for wireless connection between the master 100 and the plurality of slaves 200_1~200_N according to a second embodiment of the present disclosure, and FIG. 6 shows a lookup table for the second embodiment that the master references. The method of FIG. 5 may be performed in each predetermined cycle.

Referring to FIGS. 1 to 3, 5 and 6, in step S510, the master 100 wirelessly transmits a first command packet. The first command packet may be wirelessly transmitted with the predetermined first signal strength. The first command packet includes first data and second data, and may further include third data. The first data of the first command packet has the first value indicating that the first command packet is for trying wireless connection with the plurality of slaves 200_1~200_N for the first time in the current cycle. The second data of the first command packet includes data for requesting the plurality of slaves 200_1~200_N to perform a specific function. The third data of the first command packet includes the IDs of the plurality of slaves 200_1~200_N.

When the first data of the first command packet has the first value, each of the plurality of slaves 200_1~200_N may perform the function requested by the second data of the first command packet, and wirelessly transmit the response packet including the ID thereof with the predetermined second signal strength or the reference signal strength allocated thereto.

In step S520, the master 100 scans the response packet from the plurality of slaves 200_1~200_N for the first standby period. That is, the master 100 collects the response packet wirelessly transmitted by the plurality of slaves 200_1~200_N from the time point at which the first command packet was transmitted to the time point at which a predetermined period of time has passed from the transmission of the first command packet.

In step S530, the master 100 classifies each of the plurality of slaves 200_1~200_N as any one of the first group and the second group. In detail, the master 100 may classify the slave 200 to which the ID of each response packet scanned for the first standby period as the first group is allocated, and the remaining slave 200 as the second group. That is, the slave 200 having not transmitted the response packet or having transmitted the response packet that was not received by the master 100 may be classified as the second group by the master 100.

In step S540, the master 100 determines whether at least one of the plurality of slaves 200_1~200_N is classified as the second group. That is, the master 100 checks is at least one slave 200 is still not wirelessly connected with the master 100 in the current cycle. When a value of the step S540 is "YES", step S545 is performed. The value of the step S540 being "NO" indicates that the master 100 is wirelessly connected with all the plurality of slaves 200_1~200_N, and the method may end.

In step S545, the master 100 determines a first amplified signal strength from a lookup table 600 using an ID of the lowest rank among the IDs of at least one slave 200 belonging to the second group as an index. In detail, the lookup table 600 stores a plurality of amplified signal strengths $A_1$~$A_N$ associated with each of the IDs $S_1$~$S_N$ of the plurality of slaves 200_1~200_N. At least one of the plurality of amplified signal strengths $A_1$~$A_N$ is higher than the predetermined first signal strength. In the lookup table 600, an ID of lower rank is associated with a higher amplified signal strength. When i=1~N, for example, $S_i$ is the ID of the slave 200_i, and is associated with $A_i$, $A_{i-1} < A_i$. When as shown in FIG. 3, the slave 200_2 and the slave 200_N-1 belong to the second group, $S_{N-1}$ is the ID of the lowest rank, and thus $A_{N-1}$ is determined as the first amplified signal strength.

In step S550, the master 100 wirelessly transmits a second command packet with the first amplified signal strength. The second command packet includes first data, second data and third data. The first data of the second command packet has the second value indicating that the second command packet is for retrying wireless connection between the master 100 and the second group. The second data of the second command packet includes data for requesting all the slaves 200 belonging to the second group to perform the specific function. The third data of the second command packet includes the IDs of all the slaves 200 belonging to the second group.

When receiving the second command packet, each of the plurality of slaves 200_1~200_N determines whether the second data of the second command packet has the ID thereof in response to the first data of the second command packet having the second value. The slave 200 belonging to the second group performs the function requested by the second data of the second command packet as the third data of the second command packet includes the ID thereof, and transmits the response packet including the ID of the slave 200 with the predetermined second signal strength or the reference signal strength allocated thereto to the master 100. In contrast, the slave 200 belonging to the first group does not transmit the response packet as the second data of the second command packet does not include the ID thereof, and may delete the second command packet from the memory device thereof (i.e., ignore the request made by the third data of the second command packet).

In step S560, the master 100 scans the response packet from the slave 200 classified as the second group for the second standby period. That is, the master 100 collects the response packet wirelessly transmitted by at least one slave 200 belonging to the second group from the time point at which the second command packet was transmitted from the time point at which a predetermined period of time has passed from the transmission of the second command packet.

In step S570, the master 100 classifies each of the plurality of slaves 200_1~200_N as any one of the first group and the second group. In detail, the master 100 may classify the slave 200 to which the ID of each response packet scanned for the second standby period is allocated from the second group to the first group, and maintain the remaining slave 200 as the second group. After the step S570, the method may move to the step S540 or S580.

In step S580, the master 100 determines whether at least one of the plurality of slaves 200_1~200_N belongs to the second group. When a value of the step S580 is "YES", the method returns to the step S545. The value of the step S580 being "NO" indicates that none of the plurality of slaves 200_1~200_N belongs to the second group, and the method may end.

Figure 7:
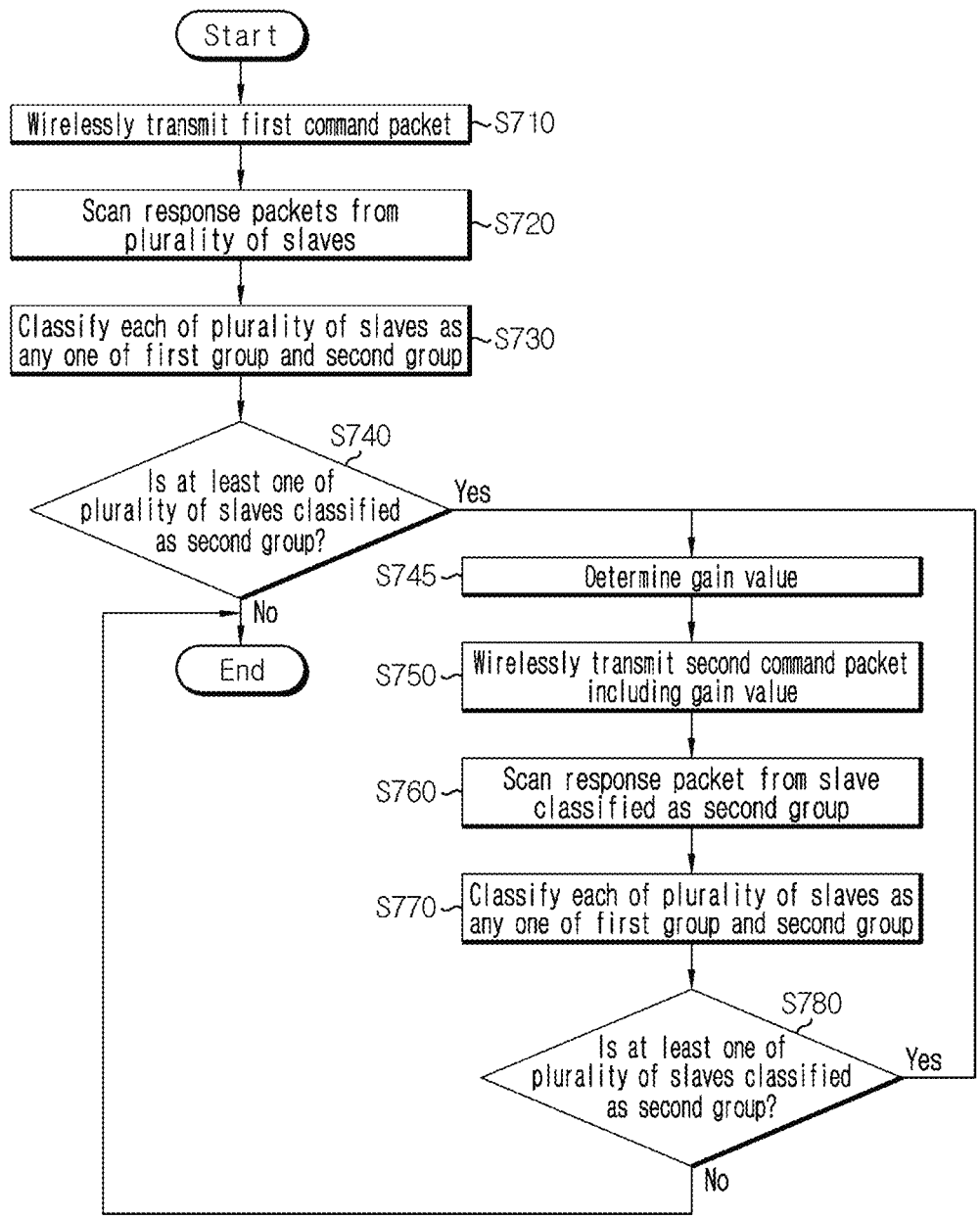
FIG. 7 is a flowchart showing a method for wireless connection between a master and a plurality of slaves according to a third embodiment of the present disclosure.

FIG. 7 is a flowchart showing a method for wireless connection between the master 100 and the plurality of slaves 200_1~200_N according to a third embodiment of the present disclosure. The method of FIG. 7 may be performed in each predetermined cycle.

Referring to FIGS. 1 to 3 and 7, in step S700, the master 100 wirelessly transmits a first command packet. The first command packet may be wirelessly transmitted with the predetermined first signal strength. The first command packet includes first data and second data, and may further include third data. The first data of the first command packet has the first value indicating that the first command packet is for trying wireless connection with the plurality of slaves 200_1~200_N for the first time in the current cycle. The second data of the first command packet includes data for requesting the plurality of slaves 200_1~200_N to perform a specific function. The third data of the first command packet includes the IDs of the plurality of slaves 200_1~200_N.

When the first data of the first command packet has the first value, each of the plurality of slaves 200_1~200_N may perform the function requested by the second data of the first command packet, and wirelessly transmit the response packet including the ID thereof with the predetermined second signal strength or the reference signal strength allocated thereto.

In step S720, the master 100 scans the response packet from the plurality of slaves 200_1~200_N for the first standby period. That is, the master 100 collects the response packet wirelessly transmitted by the plurality of slaves 200_1~200_N from the time point at which the first command packet was transmitted to the time point at which a predetermined period of time has passed from the transmission of the first command packet.

In step S730, the master 100 classifies each of the plurality of slaves 200_1~200_N as any one of the first group and the second group. In detail, the master 100 may classify the slave 200 to which the ID of each response packet scanned for the first standby period is allocated as the first group, and the remaining slave 200 as the second group. That is, the slave 200 having not transmitted the response packet or having transmitted the response packet that was not received by the master 100 may be classified as the second group by the master 100.

In step S740, the master 100 determines whether at least one of the plurality of slaves 200_1~200_N is classified as the second group. That is, the master 100 checks if at least one slave 200 is still not wirelessly connected with the master 100 in the current cycle. When a value of the step S740 is "YES", step S745 is performed. The value of the step S740 being "NO" indicates that the master 100 is wirelessly connected with all the plurality of slaves 200_1~200_N, and the method may end.

In step S745, the master 100 determines a gain value. The gain value may be greater than 1. The gain value is for inducing the slave 200 belonging to the second group to wirelessly transmit the response packet with higher signal strength than the predetermined second signal strength or the reference signal strength allocated to the corresponding slave. The master 100 may increase the gain value by a predetermined value each time the master 100 transmits a second command packet. For example, the gain value when the second command packet is transmitted first time may be 1.02, and the gain value when the second command packet is transmitted second time may be 1.05.

In step S750, the master 100 wirelessly transmits a second command packet. The second command packet may be wirelessly transmitted with the predetermined first signal strength. The second command packet includes first data, second data and third data. The first data of the second command packet has the second value indicating that the second command packet is for retrying wireless connection between the master 100 and the second group. The second data of the second command packet includes data for requesting all the slaves 200 belonging to the second group to perform the specific function. The third data of the second command packet includes the IDs of all the slaves 200 belonging to the second group. The second command packet further includes fourth data. The fourth data of the second command packet indicates the gain value determined in the step S745.

When receiving the second command packet, each of the plurality of slaves 200_1~200_N determines whether the third data of the second command packet includes the ID thereof in response to the first data of the second command packet having the second value. The slave 200 belonging to the second group may perform the function requested by the second data of the second command packet as the third data of the second command packet includes the ID thereof.

Additionally, the slave 200 belonging to the second group determines a second amplified signal strength by multiplying the predetermined second signal strength or the reference signal strength allocated thereto by the gain value indicated by the fourth data of the second command packet.

Subsequently, the slave 200 belonging to the second group transmits the response packet including the ID thereof to the master 100 with the second amplified signal strength. In contrast, the slave 200 belonging to the first group does not transmit the response packet as the second data of the second command packet does not include the ID thereof, and may delete the second command packet from the memory device thereof (i.e., ignore the request made by the third data of the second command packet).

In step S760, the master 100 scans the response packet from the slave 200 classified as the second group for the second standby period. That is, the master 100 collects the response packet wirelessly transmitted by at least one slave 200 belonging to the second group from the time point at which the second command packet was transmitted to the time point at which a predetermined period of time has passed from the transmission of the second command packet.

In step S770, the master 100 classifies each of the plurality of slaves 200_1~200_N as any one of the first group and the second group. In detail, the master 100 may classify the slave 200 to which the ID of each response packet scanned for the second standby period is allocated from the second group to the first group, and maintain the remaining slave 200 as the second group. After the S770, the method may move to the step S740 or S780.

In step S780, the master 100 determines whether at least one of the plurality of slaves 200_1~200_N belongs to the second group. When a value of the step S780 is "YES", the method returns to the step S750. The value of the step S780 being "NO" indicates that none of the plurality of slaves 200_1~200_N belongs to the second group, and the method may end.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A wireless control system, comprising:
   a master configured to wirelessly transmit a first command packet; and
   a plurality of slaves configured to monitor a condition of a plurality of battery modules,
   wherein:
   each of the plurality of slaves is configured to wirelessly transmit a response packet including an identification (ID) of the corresponding slave in response to the first command packet within a predetermined period of time from a time point at which the first command packet is transmitted,
   the master is further configured to set, as a first group, each slave to which is allocated the ID included in each response packet wirelessly received within the predetermined period of time from the time point at which the first command packet is transmitted,
   the master is further configured to set, as a second group, each slave not set as the first group among the plurality of slaves,
   the master is further configured to wirelessly transmit a second command packet if at least one of the plurality of slaves belongs to the second group, and
   the second command packet includes the ID of each slave belonging to the second group.

2. The wireless control system according to claim 1, wherein the master is further configured to wirelessly transmit the second command packet with a first amplified signal strength associated with an ID of a lowest rank among the IDs of the at least one of the plurality of slaves belonging to the second group.

3. The wireless control system according to claim 1, wherein each of the plurality of slaves is further configured to delete the second command packet if the second command packet does not include the ID of the corresponding slave.

4. The wireless control system according to claim 1, wherein each of the plurality of slaves is further configured to wirelessly transmit the response packet in response to the second command packet if the second command packet includes the ID of the corresponding slave.

5. The wireless control system according to claim 4, wherein each of the at least one of the plurality of slaves belonging to the second group is further configured to:
   determine a relative rank of the ID of the corresponding slave among all the IDs included in the second command packet if the second command packet includes the ID of the corresponding slave, and
   wirelessly transmit the response packet at a time slot allocated to the relative rank.

6. The wireless control system according to claim 4, wherein each of the at least one of the plurality of slaves belonging to the second group is further configured to:
   if the second command packet includes a gain value,
   determine a second amplified signal strength by multiplying a predetermined signal strength by the gain value, and
   wirelessly transmit the response packet with the second amplified signal strength.

7. The wireless control system according to claim 4, wherein each of the at least one of the plurality of slaves belonging to the second group is further configured to:
   if the second command packet includes a gain value,
   determine a third amplified signal strength by multiplying a reference signal strength allocated to the corresponding slave by the gain value, and
   wirelessly transmit the response packet with the third amplified signal strength.

8. The wireless control system according to claim 4, wherein the master is further configured to classify a first slave from the second group to the first group if the response packet from the first slave belonging to the second group is received within a predetermined period of time from a time point at which the second command packet is transmitted.

9. A battery pack comprising the wireless control system according to claim 1.

10. A method for wireless connection between a master and a plurality of slaves included in a wireless control system, the method comprising:
    wirelessly transmitting, by the master, a first command packet to the plurality of slaves;

wirelessly transmitting, by each slave, a response packet including an identification (ID) of the corresponding slave in response to the first command packet within a predetermined period of time from a time point at which the first command packet is transmitted;

setting, by the master, as a first group, each slave to which is allocated the ID included in each response packet wirelessly received within the predetermined period of time from the time point at which the first command packet is transmitted, and setting, as a second group, each slave not set as the first group among the plurality of slaves; and wirelessly transmitting, by the master, a second command packet including the ID of each slave belonging to the second group if at least one of the plurality of slaves belongs to the second group.

11. The method according to claim 10, further comprising:

determining, by each slave belonging to the second group, a relative rank of the ID of the corresponding slave among all the IDs included in the second command packet if the second command packet includes the ID of the corresponding slave; and wirelessly transmitting, by each slave belonging to the second group, the response packet at a time slot allocated to the relative rank.

\* \* \* \* \*